(12) United States Patent
Shin et al.

(10) Patent No.: US 12,550,570 B2
(45) Date of Patent: Feb. 10, 2026

(54) DISPLAY DEVICE

(71) Applicant: Samsung Display Co., Ltd., Yongin-Si (KR)

(72) Inventors: Hyuneok Shin, Yongin-si (KR); Juhyun Lee, Yongin-si (KR); Joonyong Park, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 18/583,867

(22) Filed: Feb. 22, 2024

(65) Prior Publication Data

US 2025/0008798 A1    Jan. 2, 2025

(30) Foreign Application Priority Data

Jun. 28, 2023 (KR) .................. 10-2023-0083591

(51) Int. Cl.
*H10K 59/131* (2023.01)
*G09G 3/32* (2016.01)

(52) U.S. Cl.
CPC .......... *H10K 59/1315* (2023.02); *G09G 3/32* (2013.01); *G09G 2300/0408* (2013.01); *G09G 2300/0426* (2013.01)

(58) Field of Classification Search
CPC ............... H10K 59/1315; G09G 3/32; G09G 2300/0408; G09G 2300/0426
See application file for complete search history.

(56) References Cited

U.S. PATENT DOCUMENTS

| | | | |
|---|---|---|---|
| 10,770,513 B2* | 9/2020 | Chae | H10K 59/50 |
| 2019/0305065 A1* | 10/2019 | Kim | H10D 86/60 |
| 2022/0059636 A1* | 2/2022 | Song | H10K 59/1315 |
| 2022/0115462 A1* | 4/2022 | Jung | H10K 59/88 |
| 2022/0149144 A1* | 5/2022 | Lee | H10K 59/65 |
| 2024/0065044 A1* | 2/2024 | Shin | H10K 59/1213 |
| 2024/0306470 A1* | 9/2024 | Shin | H10K 59/173 |

FOREIGN PATENT DOCUMENTS

KR    10-0611653 B1    8/2006

* cited by examiner

*Primary Examiner* — Ariel A Balaoing
(74) *Attorney, Agent, or Firm* — Innovation Counsel LLP

(57) ABSTRACT

A display device includes: a substrate including a main display area, a component area and a non-display area, an auxiliary light-emitting element disposed in the component area, a driver disposed in the non-display area, an auxiliary pixel circuit disposed in the non-display area, and a connecting wiring including a first portion, a second portion disposed on the first portion, and a third portion disposed on the second portion.

20 Claims, 6 Drawing Sheets

DISPLAY DEVICE

CROSS-REFERENCE TO RELATED APPLICATION(S)

This application claims priority to and benefits of Korean Patent Application No. 10-2023-0083591 under 35 U.S.C. § 119, filed on Jun. 28, 2023, in the Korean Intellectual Property Office (KIPO), the entire contents of which are incorporated herein by reference.

BACKGROUND

1. Technical Field

Embodiments relate to a display device.

2. Description of the Related Art

A display device is a device that displays an image and visually provides information to a user. Recently, as display devices have become thinner and lighter, the display devices are becoming adapted for many applications.

In addition to display devices becoming thinner and lighter, a display area of a display device is getting larger, allowing various functions to be added to the display area. Sometimes, the display device may include a component area that performs various functions while displaying an image.

SUMMARY

Embodiments provide a display device including a component area with improved display quality.

A display device according to an embodiment may include a substrate including a main display area, a component area and a non-display area, an auxiliary light-emitting element disposed in the component area, a driver disposed in the non-display area, an auxiliary pixel circuit disposed in the non-display area, and a connecting wiring including a first portion, a second portion disposed on the first portion, and a third portion disposed on the second portion.

In an embodiment, the auxiliary pixel circuit may include an auxiliary transistor.

In an embodiment, the connecting wiring may connect the auxiliary light-emitting element and the auxiliary pixel circuit.

In an embodiment, the first portion may include a transparent conductive oxide.

In an embodiment, the second portion may include a silver or a silver alloy.

In an embodiment, the third portion may include a transparent conductive oxide.

In an embodiment, the transparent conductive oxide included in the first portion may include indium tin oxide.

In an embodiment, wherein the transparent conductive oxide included in the first portion may include indium tin zinc oxide.

In an embodiment, the indium tin zinc oxide may be amorphous.

In an embodiment, a proportion of the zinc oxide in the indium tin zinc oxide may be equal to or greater than about 10 weight percent and equal to or less than about 30 weight percent.

In an embodiment, the transparent conductive oxide included in the third portion may include indium tin oxide.

In an embodiment, the transparent conductive oxide included in the third portion may include indium tin zinc oxide.

In an embodiment, the indium tin zinc oxide may be amorphous.

In an embodiment, a proportion of the zinc oxide in the indium tin zinc oxide may be equal to or greater than about 10 weight percent and equal to or less than about 30 weight percent.

In an embodiment, the silver alloy may include copper.

In an embodiment, the silver alloy may further include zinc.

In an embodiment, a proportion of the copper in the silver alloy may be equal to or greater than about 0.5 atomic percent and equal to or less than about 1 atomic percent.

In an embodiment, a proportion of the zinc in the silver alloy may be equal to or greater than about 0.5 atomic percent and equal to or less than about 1 atomic percent.

In an embodiment, the proportion of zinc in the silver alloy and the proportion of copper in the silver alloy may be the same.

In an embodiment, a thickness of the first portion may be equal to or greater than about 30 angstroms and equal to or less than about 70 angstroms.

In an embodiment, a thickness of the second portion may be equal to or greater than about 40 angstroms and equal to or less than about 60 angstroms.

In an embodiment, a thickness of the third portion may be equal to or greater than about 30 angstroms and equal to or less than about 70 angstroms.

In an embodiment, the thickness of the first portion and the thickness of the third portion may be the same.

In an embodiment, the thickness of the second portion may be greater than the thickness of the first portion.

the thickness of the second portion may be greater than the thickness of the third portion.

The display device according to an embodiment may include a main display area, a component area, and a non-display area. The auxiliary light-emitting element may be disposed in the component area. In addition, the auxiliary pixel circuit may be disposed in the non-display area. The auxiliary light-emitting element and the auxiliary pixel circuit may be connected by the connecting wiring.

The connecting wiring may include a first portion, a second portion disposed on the first portion, and a third portion disposed on the second portion. Each of the first portion and the third portion may include an amorphous indium tin zinc oxide ("ITZO"). In addition, the second portion may include a silver alloy.

Accordingly, light transmittance of the connecting wiring may be improved. In addition, sheet resistance of the connecting wiring may be reduced.

BRIEF DESCRIPTION OF THE DRAWINGS

Illustrative, non-limiting embodiments will be more clearly understood from the following detailed description in conjunction with the accompanying drawings.

DETAILED DESCRIPTION OF THE EMBODIMENTS

Figure 1:
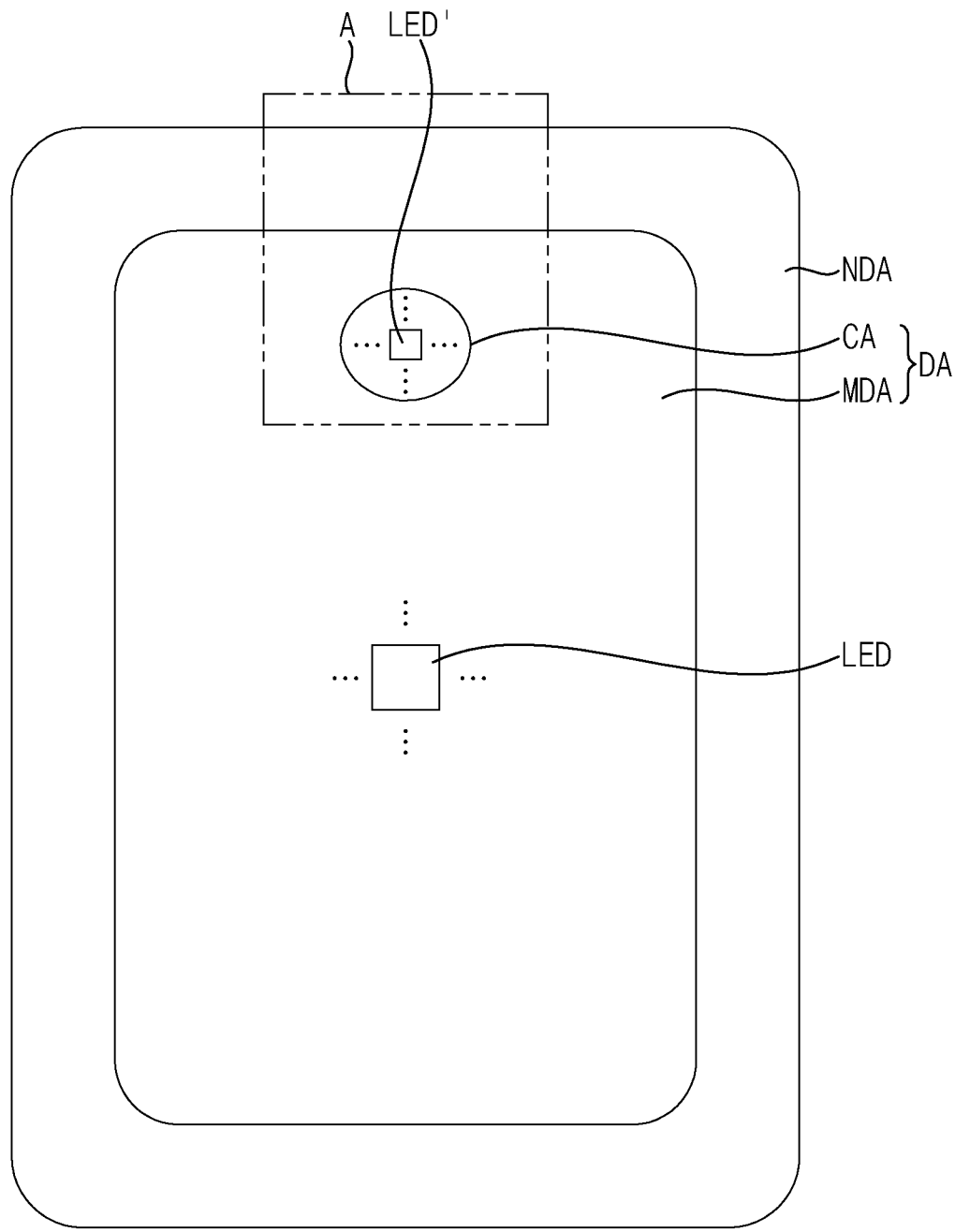
FIG. 1 is a plan view illustrating a display device according to an embodiment.

Hereinafter, display devices in accordance with embodiments will be described in more detail with reference to the accompanying drawings. The same reference numerals are used for the same components in the drawings, and redundant descriptions of the same components will be omitted.

FIG. 1 is a plan view illustrating a display device according to an embodiment.

Referring to FIG. 1, a display device DD may include a display area DA and a non-display area NDA. The display area DA may include a component area CA and a main display area MDA surrounding at least a portion of the component area CA.

The main display area MDA may be defined as an area that can either generate light or display an image by adjusting transmittance of light provided from an external light source. A main light-emitting element LED may be disposed in the main display area MDA. The main light-emitting element LED may emit light. The main light-emitting element LED may be repeatedly arranged along a first direction DR1 and a second direction DR2 crossing the first direction DR1.

The component area CA may be disposed inside the main display area MDA. In an embodiment, the component area CA may be disposed at an upper center of the main display area MDA. In another embodiment, the component area CA may be disposed at an upper left side of the main display area MDA. In another embodiment, the component area CA may be disposed at an upper right side of the main display area MDA.

In an embodiment, the component area CA may have a circular shape in a plan view. In another embodiment, the component area CA may have a shape different from the circular shape in a plan view. For example, the component area CA may have a polygonal shape in a plan view.

An auxiliary light-emitting element LED' may be disposed in the component area CA. The auxiliary light-emitting element LED' may emit light. The auxiliary light-emitting element LED' may be repeatedly arranged in the first direction DR1 and the second direction DR2.

Although not illustrated in FIG. 1, the component area CA may further include a transmitting area. Light and/or sound output from a component (e.g., a component C of FIG. 2) and traveling out of the device or traveling from the outside to the component may transmit to the transmitting area. The auxiliary light-emitting element LED' may not be disposed in the transmitting area. Accordingly, a resolution of an image provided by the component area CA may be lower than a resolution of an image provided by the main display area MDA.

The non-display area NDA may be located around the display area DA. For example, the non-display area NDA may surround at least a portion of the display area DA. A driver may be disposed in the non-display area NDA. For example, the driver may include a data driver, a gate driver, and the like.

In an embodiment, an auxiliary pixel circuit (e.g., an auxiliary pixel circuit PXC' of FIG. 2) may be further disposed in the non-display area NDA. The auxiliary pixel circuit may provide a signal or voltage to the auxiliary light-emitting element LED'. The non-display area NDA may not display an image.

Figure 2:
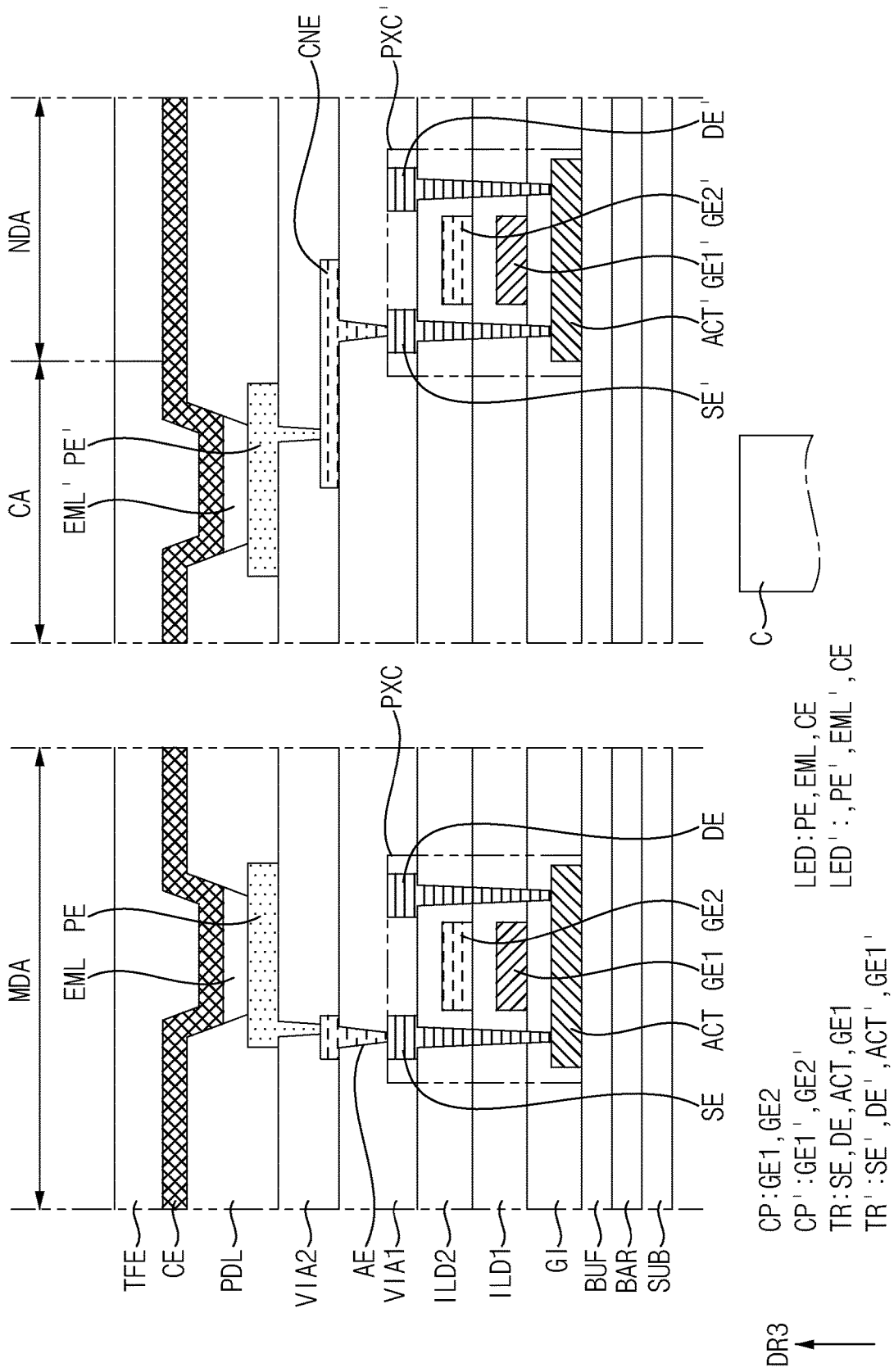
FIG. 2 is a cross-sectional view illustrating the display device of FIG. 1.

FIG. 2 is a cross-sectional view illustrating the display device of FIG. 1.

Figure 3:
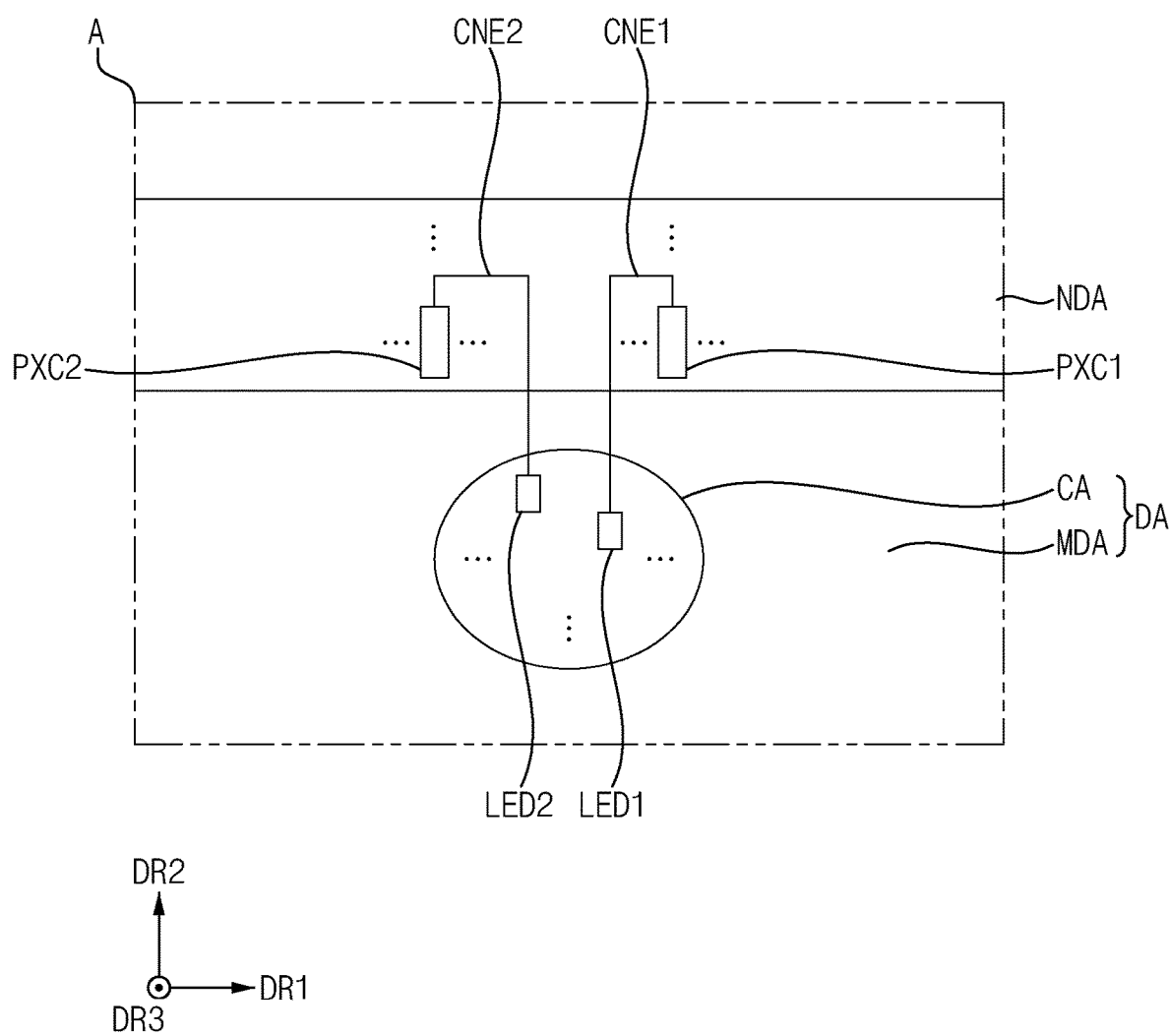
FIG. 3 is an enlarged plan view of an example of an area A of FIG. 1.

Referring to FIGS. 2 and 3, the display device DD may include a substrate SUB, a barrier layer BAR, a buffer layer BUF, a main pixel circuit PXC, an auxiliary pixel circuit PXC', a gate insulating layer GI, a first interlayer insulating layer ILD1, a second interlayer insulating layer ILD2, a first via insulating layer VIA1, a second via insulating layer VIA2, an additional wiring AE, a connecting wiring CNE, a pixel electrode PE, an auxiliary pixel electrode PE', a light-emitting layer EML, an auxiliary light-emitting layer EML', a pixel defining layer PDL, a common electrode CE, and an encapsulation layer TFE.

The substrate SUB may include a transparent material or an opaque material. The substrate SUB may be formed of a transparent resin substrate. Example of the transparent resin substrate may include a polyimide substrate. In this case, the polyimide substrate may include a first organic layer, a first barrier layer, a second organic layer, and the like.

Alternatively, the substrate SUB may include a quartz substrate, a synthetic quartz substrate, a calcium fluoride substrate, a fluorine-doped quartz substrate, a soda lime substrate, a non-alkali glass substrate, or the like. These materials may be used alone or in combination with each other. The substrate SUB may be continuously disposed over the main display area MDA, the component area CA, and the non-display area NDA.

The barrier layer BAR may be disposed on the substrate SUB. The barrier layer BAR may prevent impurities from penetrating into an upper portion of the substrate SUB from an outside. The barrier layer BAR may include an inorganic material such as silicon oxide, silicon nitride, silicon oxynitride, or the like. These materials may be used alone or in combination with each other. In addition, the barrier layer BAR may be formed in a single-layer structure or a multi-layer structure. The barrier layer BAR may be continuously disposed over the main display area MDA, the component area CA, and the non-display area NDA.

The buffer layer BUF may be disposed on the barrier layer BAR. The buffer layer BUF may prevent metal atoms or impurities from diffusing from the substrate SUB to an active pattern ACT and an auxiliary active pattern ACT'. The buffer layer BUF may be continuously disposed over the main display area MDA, the component area CA, and the non-display area NDA.

For example, the buffer layer BUF may include an inorganic material such as silicon oxide, silicon nitride, silicon oxynitride, or the like. These materials may be used alone or in combination with each other.

The main pixel circuit PXC may include a main transistor TR and a main capacitor CP. The main transistor TR may include a source electrode SE, a drain electrode DE, an active pattern ACT, and a first gate electrode GE1. The main capacitor CP may include the first gate electrode GE1 and a second gate electrode GE2. The main pixel circuit PXC may be disposed in the main display area MDA.

The auxiliary pixel circuit PXC' may include an auxiliary transistor TR' and an auxiliary capacitor CP'. The auxiliary transistor TR' may include an auxiliary source electrode SE', an auxiliary drain electrode DE', an auxiliary active pattern ACT', and a first auxiliary gate electrode GE1'. The auxiliary capacitor CP' may include a first auxiliary gate electrode GE1' and a second auxiliary gate electrode GE2'. In an embodiment, the auxiliary pixel circuit PXC' may be disposed in the non-display area NDA.

The active pattern ACT may be disposed on the buffer layer BUF. The active pattern ACT may include a source area, a drain area, and a channel area disposed between the source area and the drain area. The active pattern ACT may be disposed in the main display area MDA.

The active pattern ACT may include an inorganic semiconductor (e.g., amorphous silicon, polysilicon, a metal oxide semiconductor), an organic semiconductor, and the like. These materials may be used alone or in combination with each other.

The metal oxide semiconductor may include a binary compound ("$AB_x$"), a ternary compound ("$AB_xC_y$"), a tetragonal compound ("$AB_xC_yD_z$"), and the like including indium ("In"), zinc ("Zn"), gallium ("Ga"), tin ("Sn"), titanium ("Ti"), aluminum ("Al"), hafnium ("Hf"), zirconium ("Zr"), magnesium ("Mg"), or the like.

For example, the metal oxide semiconductor may include zinc oxide ("$ZnO_x$"), gallium oxide ("$GaO_x$"), tin oxide ("$SnO_x$"), indium oxide ("$InO_x$"), indium gallium oxide ("IGO"), indium zinc oxide ("IZO"), indium tin oxide ("ITO"), indium zinc tin oxide ("IZTO"), and indium gallium zinc oxide ("IGZO"). These materials may be used alone or in combination with each other.

The auxiliary active pattern ACT' may be disposed on the buffer layer BUF. The auxiliary active pattern ACT' may include a source area, a drain area, and a channel area disposed between the source area and the drain area. The auxiliary active pattern ACT' may be disposed in the non-display area NDA.

The auxiliary active pattern ACT' may be formed on the same layer as the active pattern ACT. In addition, the auxiliary active pattern ACT' may be formed through the same process as the active pattern ACT. In addition, the auxiliary active pattern ACT' may include substantially the same material as the active pattern ACT.

The gate insulating layer GI may be disposed on the buffer layer BUF. The gate insulating layer GI may cover the active pattern ACT and the auxiliary active pattern ACT'. The gate insulating layer GI may be continuously disposed over the main display area MDA, the component area CA, and the non-display area NDA.

For example, the gate insulating layer GI may include inorganic materials such as silicon oxide, silicon nitride, silicon carbide, silicon oxynitride, silicon oxycarbide, or the like. These materials may be used alone or in combination with each other.

The first gate electrode GE1 may be disposed on the gate insulating layer GI. The first gate electrode GE1 may overlap the channel area of the active pattern ACT. The first gate electrode GE1 may be disposed in the main display area MDA.

The first gate electrode GE1 may include a metal, an alloy metal nitride, a conductive metal oxide, a transparent conductive material, or the like. These materials may be used alone or in combination with each other.

Examples of the metal may include silver ("Ag"), molybdenum ("Mo"), aluminum ("Al"), tungsten ("W"), copper ("Cu"), nickel ("Ni"), chromium ("Cr"), titanium ("Ti"), tantalum ("Ta"), platinum ("Pt"), scandium ("Sc"), or the like. These materials may be used alone or in combination with each other.

Examples of the conductive metal oxide may include Indium tin oxide, indium zinc oxide, or the like. These materials may be used alone or in combination with each other.

In addition, examples of the metal nitride may include aluminum nitride ("$AlN_x$"), tungsten nitride ("$WN_x$"), chromium nitride ("$CrN_x$"), or the like. These materials may be used alone or in combination with each other.

The first auxiliary gate electrode GE1' may be disposed on the gate insulating layer GI. The first auxiliary gate electrode GE1' may overlap the channel area of the auxiliary active pattern ACT'. In an embodiment, the first auxiliary gate electrode GE1' may be disposed in the non-display area NDA.

The first auxiliary gate electrode GE1' may be formed on the same layer as the first gate electrode GE1. In addition, the first auxiliary gate electrode GE1' may be formed through the same process as the first gate electrode GE1, possibly at the same time as the first gate electrode GE1. In addition, the first auxiliary gate electrode GE1' may include substantially the same material as the first gate electrode GE1.

The first interlayer insulating layer ILD1 may be disposed on the gate insulating layer GI. The first interlayer insulating layer ILD1 may cover the first gate electrode GE1 and the first auxiliary gate electrode GE1'. The first interlayer insulating layer ILD1 may be continuously disposed over the main display area MDA, the component area CA, and the non-display area NDA.

For example, the first interlayer insulating layer ILD1 may include inorganic materials such as silicon oxide, silicon nitride, silicon carbide, silicon oxynitride, silicon oxycarbide, or the like. These materials may be used alone or in combination with each other.

The second gate electrode GE2 may be disposed on the first interlayer insulating layer ILD1. The second gate electrode GE2 may overlap the first gate electrode GE1. The second gate electrode GE2 may include the same material as the first gate electrode GE1.

The second auxiliary gate electrode GE2' may be disposed on the first interlayer insulating layer ILD1. The second auxiliary gate electrode GE2' may overlap the first auxiliary gate electrode GE1.

The second auxiliary gate electrode GE2' may be formed on the same layer as the second gate electrode GE2. In addition, the second auxiliary gate electrode GE2' may be formed through the same process as the second gate electrode GE2. In addition, the second auxiliary gate electrode GE2' may include substantially the same material as the second gate electrode GE2.

The second interlayer insulating layer ILD2 may be disposed on the first interlayer insulating layer ILD1. The second interlayer insulating layer ILD2 may sufficiently cover the second gate electrode GE2 and the second auxiliary gate electrode GE2'. The second interlayer insulating layer ILD2 may be continuously disposed over the main display area MDA, the component area CA, and the non-display area NDA.

For example, the second interlayer insulating layer ILD2 may include inorganic materials such as silicon oxide, silicon nitride, silicon carbide, silicon oxynitride, silicon oxycarbide, or the like. These materials may be used alone or in combination with each other.

The source electrode SE may be disposed on the second interlayer insulating layer ILD2. The source electrode SE may be connected to the source area of the active pattern ACT through a contact hole penetrating the second interlayer insulating layer ILD2, the first interlayer insulating layer ILD1, and the gate insulating layer GI.

The drain electrode DE may be disposed on the second interlayer insulating layer ILD2. The drain electrode DE may be connected to the drain area of the active pattern ACT through a contact hole penetrating the second interlayer insulating layer ILD2, the first interlayer insulating layer ILD1, and the gate insulating layer GI.

For example, the source electrode SE may include a metal, an alloy metal nitride, a conductive metal oxide, a transparent conductive material, or the like. These materials may be used alone or in combination with each other.

The drain electrode DE may be formed on the same layer as the source electrode SE. In addition, the drain electrode DE may be formed through the same process as the source electrode SE. In addition, the drain electrode DE may include substantially the same material as the source electrode SE.

The auxiliary source electrode SE' may be disposed on the second interlayer insulating layer ILD2. The auxiliary source electrode SE' may be connected to the source area of the auxiliary active pattern ACT' through a contact hole extending through the second interlayer insulating layer ILD2, the first interlayer insulating layer ILD1, and the gate insulating layer GI.

The auxiliary source electrode SE' may be formed on the same layer as the source electrode SE. In addition, the auxiliary source electrode SE' may be formed through the same process as the source electrode SE. In addition, the auxiliary source electrode SE' may include substantially the same material as the source electrode SE.

The auxiliary drain electrode DE' may be disposed on the second interlayer insulating layer ILD2. The auxiliary drain electrode DE' may be connected to the drain area of the auxiliary active pattern ACT' through a contact hole penetrating the second interlayer insulating layer ILD2, the first interlayer insulating layer ILD1, and the gate insulating layer GI.

The auxiliary drain electrode DE' may be formed on the same layer as the auxiliary source electrode SE'. In addition, the auxiliary drain electrode DE' may be formed through the same process as the auxiliary source electrode SE'. In addition, the auxiliary drain electrode DE' may include substantially the same material as the auxiliary source electrode SE'.

The first via insulating layer VIA1 may be disposed on the second interlayer insulating layer ILD2. The first via insulating layer VIA1 may sufficiently cover the source electrode SE, the drain electrode DE, the auxiliary source electrode SE', and the auxiliary drain electrode DE'. The first via insulating layer VIA1 may have a substantially flat top surface without generating a step around each of the source electrode SE, the drain electrode DE, the auxiliary source electrode SE', and the auxiliary drain electrode DE'. The first via insulating layer VIA1 may be continuously disposed over the main display area MDA, the component area CA, and the non-display area NDA.

The first via insulating layer VIA1 may include an organic material. For example, the first via insulating layer VIA1 may include organic materials such as phenolic resin, acrylic resin, polyimide resin, polyamide resin, siloxane resin, epoxy resin, or the like. These materials may be used alone or in combination with each other.

The additional wiring AE may be disposed on the first via insulating layer VIA1. The additional wiring AE may be connected to the source electrode SE through a contact hole extending through the first via insulating layer VIA1. The additional wiring AE may be disposed in the main display area MDA.

The additional wiring may include a metal, an alloy metal nitride, a conductive metal oxide, a transparent conductive material, or the like. These materials may be used alone or in combination with each other.

The connecting wiring CNE may be disposed on the first via insulating layer VIA1. The auxiliary light-emitting element LED' and the auxiliary pixel circuit PXC' may be connected to each other through the connecting wiring CNE. Specifically, the connecting wiring CNE may be connected to the auxiliary source electrode SE' through a contact hole penetrating the first via insulating layer VIA1.

In an embodiment, the connecting wiring CNE may be continuously disposed over the component area CA and the non-display area NDA. In addition, the connecting wiring CNE may be formed on the same layer as the additional wiring AE.

The second via insulating layer VIA2 may be disposed on the first via insulating layer VIA1. The second via insulating layer VIA2 may cover the additional wiring AE and the connecting wiring CNE and form a substantially flat top surface without a step or unevenness around each of the additional wiring AE and the connecting wiring CNE. The second via insulating layer VIA2 may be continuously disposed over the main display area MDA, the component area CA, and the non-display area NDA.

The second via insulating layer VIA2 may include an organic material. For example, the second via insulating layer VIA2 may include organic materials such as phenolic resin, acrylic resin, polyimide resin, polyamide resin, siloxane resin, epoxy resin, or the like. These materials may be used alone or in combination with each other.

The pixel electrode PE may be disposed on the second via insulating layer VIA2. The pixel electrode PE may be connected to the additional wiring AE through a contact hole extending through the second via insulating layer VIA2. The pixel electrode PE may be disposed in the main display area MDA.

The pixel electrode PE may include a metal, an alloy, a metal nitride, a conductive metal oxide, a transparent conductive material, or the like. These materials be used alone or in combination with each other. In an embodiment, the pixel electrode PE may have a stacked structure including ITO/Ag/ITO. For example, the pixel electrode PE may operate as an anode.

The auxiliary pixel electrode PE' may be disposed on the second via insulating layer VIA2. The auxiliary pixel electrode PE' may be connected to the connecting line CNE through a contact hole penetrating the second via insulating layer VIA2. The auxiliary pixel electrode PE' may be disposed in the component area CA.

The auxiliary pixel electrode PE' may be formed on the same layer as the pixel electrode PE. In addition, the auxiliary pixel electrode PE' may be formed through the same process as the pixel electrode PE. In addition, the auxiliary pixel electrode PE' may include substantially the same material as the pixel electrode PE.

The pixel defining layer PDL may be disposed on the first via insulating layer VIA'. The pixel defining layer PDL may cover side portions of the pixel electrode PE. In addition, a first opening exposing a portion of an upper surface of the pixel electrode PE may be defined in the pixel defining layer PDL.

In addition, the pixel defining layer PDL may cover side portions of the auxiliary pixel electrode PE'. In addition, a second opening exposing a portion of an upper surface of the auxiliary pixel electrode PE' may be defined in the pixel defining layer PDL.

For example, the pixel defining layer PDL may include an inorganic material or an organic material. In an embodiment, the pixel defining layer PDL may include an organic material such as an epoxy resin, a siloxane resin, or the like. These materials may be used alone or in combination with each other. In another embodiment, the pixel defining layer PDL may further include a light blocking material containing a black pigment, a black dye, and the like.

The light-emitting layer EML may be disposed on the pixel electrode PE. The light-emitting layer EML may include an organic material that emits light of a predetermined color. For example, the light-emitting layer EML may include an organic material that emits red light. However, the present disclosure is not limited thereto, and the light-emitting layer EML may emit light of a different color from red light. The light-emitting layer EML may be disposed in the main display area MDA.

The auxiliary light-emitting layer EML' may be disposed on the auxiliary pixel electrode PE'. The auxiliary light-emitting layer EML' may be disposed in the component area CA. The auxiliary light-emitting layer EML' may be formed on the same layer as the light-emitting layer EML. In addition, the auxiliary light-emitting layer EML' may be formed through the same process as the light-emitting layer EML. In addition, the auxiliary light-emitting layer EML' may include substantially the same material as the light-emitting layer EML.

The common electrode CE may be disposed on the light-emitting layer EML, the auxiliary light-emitting layer EML', and the pixel defining layer PDL. In an embodiment, the common electrode CE may be continuously disposed over the main display area MDA, the component area CA, and the non-display area NDA. That is, the common electrode CE may be integrally formed over the main display area MDA, the component area CA, and the non-display area NDA.

In another embodiment, the common electrode CE may be disposed as separate sections in the main display area MDA and the component area CA. In addition, the common electrode CE may be disposed as separate sections in the component area CA and the non-display area NDA.

The common electrode CE may include a metal, an alloy, a metal nitride, a conductive metal oxide, a transparent conductive material, or the like. These materials may be used alone or in combination with each other. The common electrode CE may operate as a cathode.

The light-emitting element LED may include a pixel electrode PE, a light-emitting layer EML, and a first portion of the common electrode CE. The first portion of the common electrode CE may be disposed in the main display area MDA.

In addition, the auxiliary light-emitting element LED' may include the auxiliary pixel electrode PE', the auxiliary light-emitting layer EML', and a second portion of the common electrode CE. The second portion of the common electrode CE may be disposed in the component area CA.

The encapsulation layer TFE may be disposed on the common electrode CE. The encapsulation layer TFE may prevent impurities, moisture, and the like from penetrating into the pixel electrode PE, the light-emitting layer EML, the common electrode CE, the auxiliary pixel electrode PE', and the auxiliary light-emitting layer EML' from the outside. The encapsulation layer TFE may be continuously disposed over the main display area MDA, the component area CA, and the non-display area NDA.

The encapsulation layer TFE may include at least one inorganic layer and at least one organic layer. For example, the inorganic layer may include silicon oxide, silicon nitride, silicon oxynitride, and the like. These materials may be used alone or in combination with each other. The organic layer may include a polymer cured product such as polyacrylate.

The component C may be disposed under the substrate SUB. The component C may be disposed in the component area CA. For example, the component C may include an imaging device. The imaging device may be a camera using infrared rays or visible rays. For example, the component C may include a solar cell, a flash, an illuminance sensor, a proximity sensor, an iris sensor, and the like. For example, the component C may include a function of receiving sound.

Figure 4:
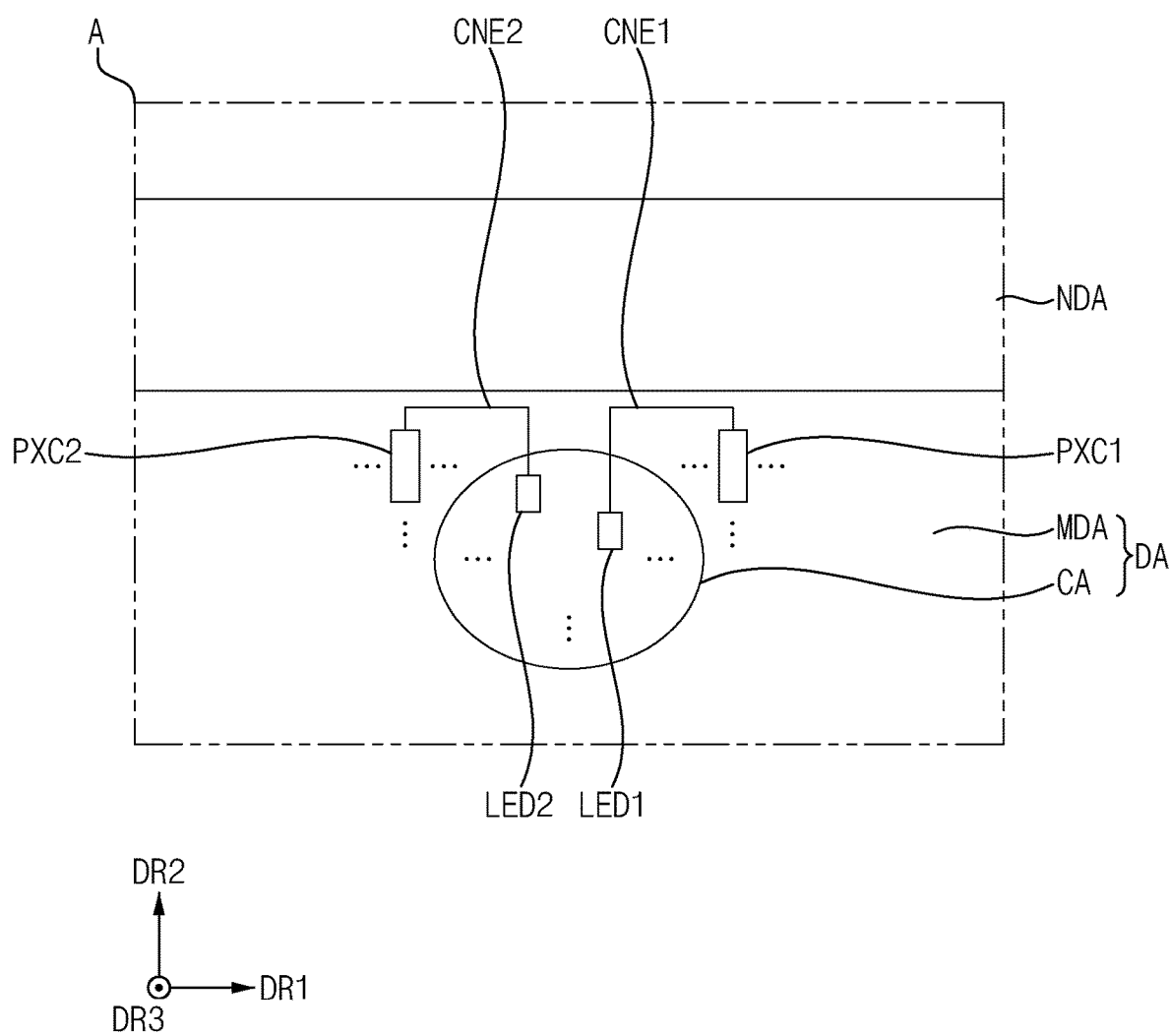
FIG. 4 is an enlarged plan view of another example of the area A of FIG. 1.
Figure 5:
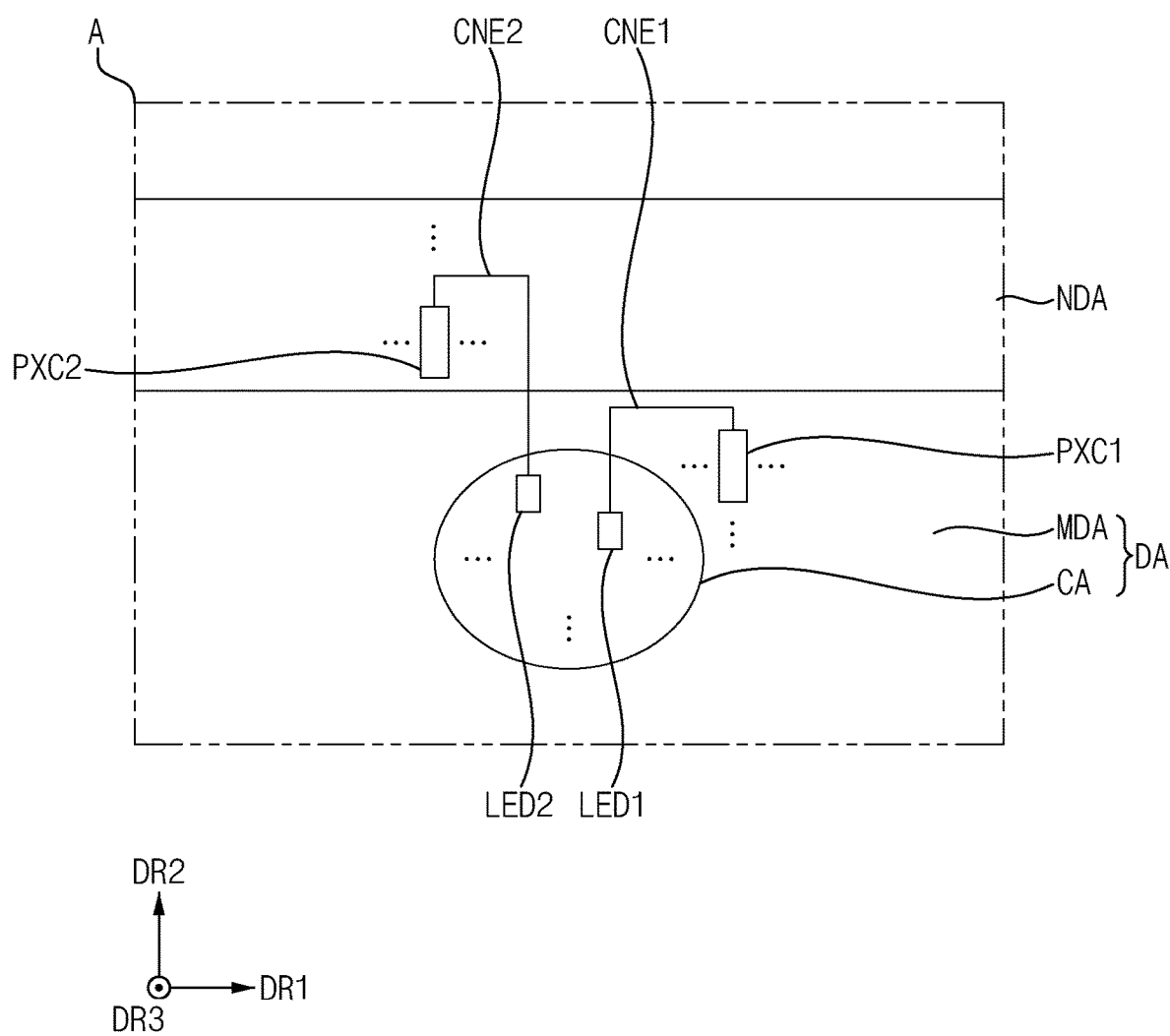
FIG. 5 is an enlarged plan view of another example of the area A of FIG. 1.

FIG. 3 is an enlarged plan view of an example of an area A of FIG. 1. FIG. 4 is an enlarged plan view of another example of the area A of FIG. 1. FIG. 5 is an enlarged plan view of another example of the area A of FIG. 1.

Referring to FIGS. 2 and 3, the auxiliary light-emitting element LED' may be disposed in the component area CA. For example, a first auxiliary light-emitting element LED1 and a second auxiliary light-emitting element LED2 may be disposed in the component area CA. The first auxiliary light-emitting element LED1 and the second auxiliary light-emitting element LED2 may be spaced apart from each other.

The auxiliary pixel circuit PXC' may be disposed in the non-display area NDA. For example, a first auxiliary pixel circuit PXC1 and a second auxiliary pixel circuit PXC2 may be disposed in the non-display area NDA. The first auxiliary pixel circuit PXC1 and the second auxiliary pixel circuit PXC2 may be spaced apart from each other.

The auxiliary light-emitting element LED' and the auxiliary pixel circuit PXC' may be connected to each other through the connecting wiring CNE. For example, the first auxiliary light-emitting element LED1 and the first auxiliary pixel circuit PXC1 may be connected through a first connecting wiring CNE1. In addition, the second auxiliary light-emitting element LED2 and the second auxiliary pixel circuit PXC2 may be connected through the second connecting wiring CNE2.

FIGS. 2 and 3 may illustrate an example in which each of the first auxiliary pixel circuit PXC1 and the second auxiliary pixel circuit PXC2 is disposed in the non-display area NDA. However, this disclosure is not limited thereto.

Referring to FIG. 4, in another embodiment, each of the first auxiliary pixel circuit PXC1 and the second auxiliary pixel circuit PXC2 may be disposed in the main display area MDA.

Referring to FIG. 5, in another embodiment, the first auxiliary pixel circuit PXC1 may be disposed in the main display area MDA. In addition, the second auxiliary pixel circuit PXC2 may be disposed in the non-display area NDA.

Figure 6:
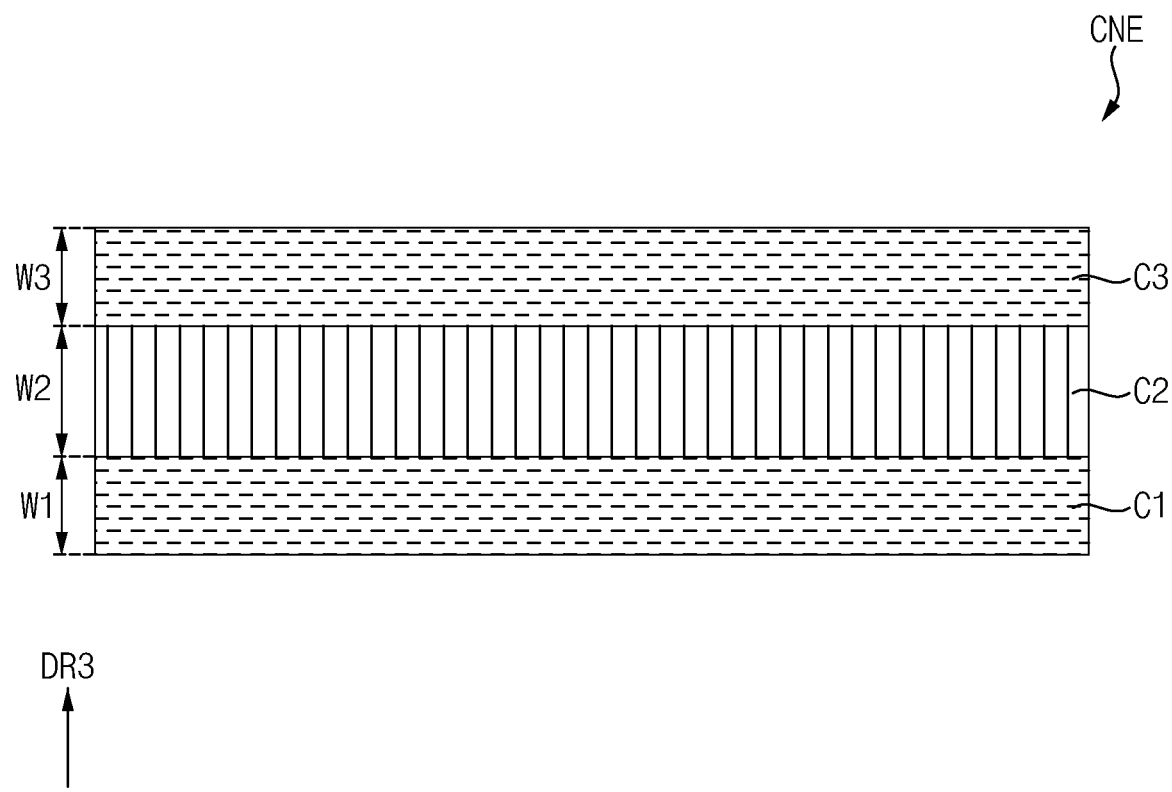
FIG. 6 is a cross-sectional view illustrating a connecting wiring included in the display device of FIG. 2.

FIG. 6 is a cross-sectional view illustrating a connecting wiring included in the display device of FIG. 2.

Referring to FIG. 6, the connecting wiring CNE may include a first portion C1, a second portion C2, and a third portion C3. The second portion C2 may be disposed on the first portion C1. In addition, the third portion C3 may be disposed on the second portion C2.

In an embodiment, the first portion C1 may include a transparent conductive oxide ("TCO"). For example, the first portion C1 may include an indium tin zinc oxide ("ITZO").

However, this disclosure is not limited thereto. For example, the first portion C1 may include an indium tin oxide ("ITO"), an indium zinc oxide ("IZO"), a gallium zinc oxide ("GZO"), an indium gallium zinc oxide ("IGZO"), or the like. These materials may be used alone or in combination with each other.

Indium tin zinc oxide may be a material obtained by doping the indium tin oxide with a zinc oxide ("ZnO").

In an embodiment, the first portion C1 may include an amorphous transparent conductive oxide. For example, the first portion C1 may include an amorphous indium tin zinc oxide.

The amorphous transparent conductive oxide, such as the amorphous indium tin zinc oxide, may maintain an amorphous state even during heat treatment. Therefore, when a manufacturing process of the display device (e.g., the display device DD of FIG. 1) proceeds at a high process temperature, the first portion C1 may maintain an amorphous state.

As the first portion C1 may include amorphous indium tin zinc oxide, light transmittance of the connecting wiring CNE may be improved. In addition, a sheet resistance of the connecting wiring CNE may be reduced.

In an embodiment, a ratio of the zinc oxide in the indium tin zinc oxide may be equal to or greater than about 10 weight percent and equal to or less than about 30 weight percent. When the ratio of the zinc oxide is less than about 10 weight percent, the first portion C1 may become a crystallization state. That is, the first portion C1 may not maintain the amorphous state.

Light may be incident on the display device. The light incident on the display device may be reflected by an electrode disposed under the connecting wiring CNE. The light reflected by the electrode may be incident on a lower surface of the first portion C1. The light incident on the lower surface of the first portion C1 may be divided into a first light reflected from the lower surface of the first portion C1 and a second light reflected from an upper surface of the first portion C1. The first light and the second light may be dissipated due to offset interference.

When the proportion of zinc oxide exceeds about 30 weight percent, a refractive index of the first portion C1 may be lowered. In this case, the offset interference may not occur between the first light and the second light. Accordingly, the first light and the second light may not disappear. Accordingly, the first light and the second light may be visually recognized by the display device user.

However, this explains one possible mechanism by which the light incident on the display device performs the offset interference, and there is another mechanism by which light incident on the display device may achieve offset interference. With the latter mechanism, light that is incident on the display device may not disappear when the ratio of the zinc oxide exceeds about 30 weight percent.

In an embodiment, a thickness W1 of the first portion C1 may be equal to or greater than about 30 angstroms and equal to or less than about 70 angstroms. When the thickness W1 of the first portion C1 exceeds about 70 angstroms, a difference in cut dimension loss (CD skew) may occur between the first portion C1 and the second portion C2.

The second portion C2 may include a silver ("Ag"), and the silver may have a weaker chemical resistance than a transparent conductive material. The first portion C1 may protect the second portion C2 having weak chemical resistance. When the thickness W1 of the first portion C1 is less than about 30 angstroms, the first portion C1 may not sufficiently protect the second portion C2.

The second portion C2 may include silver. In addition, the second portion C2 may include a silver alloy. In an embodiment, the silver alloy may include copper. In an embodiment, the silver alloy may further include zinc.

As the second portion C2 includes silver alloy, light transmittance of the connecting line CNE may be improved. In addition, sheet resistance of the connecting wiring CNE may be reduced.

In addition, if the second portion C2 includes silver alloy, pure silver may not agglomerate. Thus, preferably, the second portion C2 may include the silver alloy.

In an embodiment, proportion of copper in the silver alloy may be equal to or greater than about 0.5 atomic percent and equal to or less than about 1 atomic percent. In an embodiment, proportion of zinc in the silver alloy may be equal to or greater than about 0.5 atomic percent and equal to or less than about 1 atomic percent.

When copper makes up less than about 0.5 atomic percent, a sheet resistance of the second portion C2 may increase. In addition, when zinc makes up less than about 0.5 atomic percent, the sheet resistance of the second portion C2 may increase.

If the proportion of copper exceeds about 1 atomic percent, particles of the copper may agglomerate together. In addition, when the proportion of the zinc exceeds about 1 atomic percent, particles of the zinc may agglomerate together.

In an embodiment, the proportion of zinc in the silver alloy and the proportion of copper in the silver alloy may be substantially the same. In another embodiment, the proportion of zinc in the silver alloy and the proportion of copper in the silver alloy may be different from each other.

In an embodiment, a thickness W2 of the second portion C2 may be equal to or greater than about 40 angstroms and equal to or less than about 60 angstroms. When the thickness W2 of the second portion C2 exceeds about 60 angstroms, light transmittance of the second portion C2 may be reduced.

When the thickness W2 of the second portion C2 is less than about 40 angstroms, the sheet resistance of the second portion C2 may increase.

In an embodiment, the third portion C3 may include a transparent conductive oxide. For example, the third portion C3 may include an indium tin zinc oxide.

However, this disclosure is not limited thereto. For example, the third portion C3 may include an indium tin oxide, an indium zinc oxide, a gallium zinc oxide, an indium gallium zinc oxide, or the like. These materials may be used alone or in combination with each other.

In an embodiment, the third portion C3 may include an amorphous transparent conductive oxide. For example, the third portion C3 may include an amorphous indium tin zinc oxide.

The amorphous transparent conductive oxide, such as the amorphous indium tin zinc oxide, may maintain an amorphous state even during heat treatment. Therefore, when a manufacturing process of the display device proceeds at a high process temperature, the third portion C3 may maintain an amorphous state.

As the third portion C3 may include amorphous indium tin zinc oxide, the light transmittance of the connecting wiring CNE may be improved. In addition, the sheet resistance of the connecting wiring CNE may be reduced.

In an embodiment, a proportion of the zinc oxide in the indium tin zinc oxide of the third portion C3 may be equal to or greater than about 10 weight percent and equal to or less than about 30 weight percent. When the proportion of the zinc oxide of the third portion C3 is less than about 10 weight percent, the third portion C3 may become a crystallization state. That is, the third portion C3 may not maintain the amorphous state.

Light may be incident on the display device. The light incident on the display device may be reflected by an electrode disposed under the connecting wiring CNE. The light reflected by the electrode may be incident on a lower surface of the third portion C3. The light incident to the lower surface of the third portion C3 may be divided into a first light reflected from the lower surface of the third portion C3 and a second light reflected from an upper surface of the third portion C3. The first light and the second light may dissipate due to offset interference.

When the proportion of the zinc oxide of the third portion C3 exceeds about 30 weight percent, a refractive index of the third portion C3 may be lowered. In this case, the offset interference may not occur between the first light and the second light. Accordingly, the first light and the second light may not disappear. Accordingly, the first light and the second light may be visually recognized by the display device user.

However, this explains one possible mechanism by which light incident on the display device performs the offset interference, and there is another mechanism by which light incident on the display device may achieve offset interference. With the latter mechanism, when the proportion of zinc oxide of the third portion C3 exceeds about 30 weight percent, light incident on the display device may not disappear.

In an embodiment, a thickness W3 of the third portion C3 may be equal to or greater than about 30 angstroms and equal to or less than about 70 angstroms. When the thickness W3 of the third portion C3 exceeds about 70 angstroms, a difference in cut dimension loss (CD skew) may occur between the second portion C2 and the third portion C3.

The third portion C3 may protect the second portion C2 having weak chemical resistance. When the thickness W3 of the third portion C3 is less than about 30 angstroms, the third portion C3 may not sufficiently protect the second portion C2.

In an embodiment, the thickness W3 of the third portion and the thickness W1 of the first portion W1 may be substantially the same. In another embodiment, the thickness W3 of the third portion and the thickness W1 of the first portion W1 may be different from each other.

In an embodiment, the thickness W2 of the second portion C2 may be greater than the thickness W1 of the first portion C1. In another embodiment, the thickness W2 of the second portion C2 and the thickness W1 of the first portion C1 may be substantially the same. In another embodiment, the thickness W2 of the second portion C2 may be less than the thickness W1 of the first portion C1.

In an embodiment, the thickness W2 of the second portion C2 may be greater than the thickness W3 of the third portion C3. In another embodiment, the thickness W2 of the second portion C2 and the thickness W3 of the third portion C3 may be substantially the same. In another embodiment, the thickness W2 of the second portion C2 may be less than the thickness W3 of the third portion C3.

The present disclosure can be applied to various display devices. For example, the present disclosure is applicable to various display devices such as display devices for vehicles, ships and aircraft, portable communication devices, display devices for exhibition or information transmission, medical display devices, and the like.

The foregoing is illustrative of embodiments and is not to be construed as limiting. Although a few embodiments are described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A display device comprising:
a substrate including a main display area, a component area and a non-display area;
an auxiliary light-emitting element disposed in the component area and including an auxiliary pixel electrode;
a driver disposed in the non-display area;
an auxiliary pixel circuit disposed in the non-display area, the auxiliary pixel circuit including an auxiliary transistor; and
a connecting wiring including a first portion, a second portion disposed on the first portion, and a third portion disposed on the second portion, the connecting wiring connecting the auxiliary light-emitting element and the auxiliary pixel circuit, wherein the first portion includes a transparent conductive oxide, the second portion includes a silver or a silver alloy, and the third portion includes a transparent conductive oxide,
wherein the auxiliary pixel electrode of the auxiliary light-emitting element is connected to the third portion of the connecting wiring through a contact hole, and
wherein the first portion of the connecting wiring and the third portion of the connecting wiring are electrically connected to each other through the second portion of the connecting wiring.

2. The display device of claim 1, wherein the transparent conductive oxide in the first portion includes indium tin oxide.

3. The display device of claim 1, wherein the transparent conductive oxide in the first portion includes indium tin zinc oxide.

4. The display device of claim 3, wherein the indium tin zinc oxide is amorphous.

5. The display device of claim 4, wherein a proportion of the zinc oxide in the indium tin zinc oxide is equal to or greater than about 10 weight percent and equal to or less than about 30 weight percent.

6. The display device of claim 1, wherein the transparent conductive oxide included in the third portion includes indium tin oxide.

7. The display device of claim 1, wherein the transparent conductive oxide in the third portion includes indium tin zinc oxide.

8. The display device of claim 7, wherein the indium tin zinc oxide is amorphous.

9. The display device of claim 8, wherein a proportion of the zinc oxide in the indium tin zinc oxide is equal to or greater than about 10 weight percent and equal to or less than about 30 weight percent.

10. The display device of claim 1, wherein the silver alloy includes copper.

11. The display device of claim 10, wherein the silver alloy further includes zinc.

12. The display device of claim 11, wherein a proportion of the copper in the silver alloy is equal to or greater than about 0.5 atomic percent and equal to or less than about 1 atomic percent.

13. The display device of claim 12, wherein a proportion of the zinc in the silver alloy is equal to or greater than about 0.5 atomic percent and equal to or less than about 1 atomic percent.

14. The display device of claim 13, wherein the proportion of zinc in the silver alloy and the proportion of copper in the silver alloy are the same.

15. The display device of claim 1, wherein a thickness of the first portion is equal to or greater than about 30 angstroms and equal to or less than about 70 angstroms.

16. The display device of claim 15, wherein a thickness of the second portion is equal to or greater than about 40 angstroms and equal to or less than about 60 angstroms.

17. The display device of claim 15, wherein a thickness of the third portion is equal to or greater than about 30 angstroms and equal to or less than about 70 angstroms.

18. The display device of claim 17, wherein the thickness of the first portion and the thickness of the third portion are the same.

19. The display device of claim 17, wherein the thickness of the second portion is greater than the thickness of the first portion.

20. The display device of claim 17, wherein the thickness of the second portion is greater than the thickness of the third portion.

* * * * *